United States Patent
Sanjeevarao et al.

(10) Patent No.: US 8,625,365 B2
(45) Date of Patent: Jan. 7, 2014

(54) MEMORY DEVICE AND METHOD USING ENCODE VALUES FOR ACCESS ERROR CONDITION DETECTION

(75) Inventors: Padmaraj Sanjeevarao, Austin, TX (US); David W. Chrudimsky, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 209 days.

(21) Appl. No.: 13/212,478

(22) Filed: Aug. 18, 2011

(65) Prior Publication Data

US 2013/0044558 A1  Feb. 21, 2013

(51) Int. Cl.
  *G11C 7/00* (2006.01)
(52) U.S. Cl.
  USPC .................................. 365/189.07; 365/230.06
(58) Field of Classification Search
  USPC ......................... 365/189.07, 230.06
  See application file for complete search history.

(56) References Cited

U.S. PATENT DOCUMENTS

| | | | |
|---|---|---|---|
| 7,092,270 B2 | 8/2006 | Lee et al. | |
| 7,593,272 B2 | 9/2009 | Doyle et al. | |
| 7,788,444 B2 | 8/2010 | Lee et al. | |
| 2009/0037782 A1 | 2/2009 | Hughes | |
| 2010/0269018 A1* | 10/2010 | Clark et al. | 714/763 |

OTHER PUBLICATIONS

Yao, X. et al., "Single Event Transient Mitigation in Cache Memory using Transient Error Checking Circuits," Custom Integrated Circuits Conference (CICC), 2010 IEEE; Sep. 19-22, 2010; ISBN 978-1-4244-5760-1; 4 pages.

* cited by examiner

*Primary Examiner* — Hoai V Ho

(57) ABSTRACT

A memory module decodes an address to determine a one or more wordline select pattern, or other spatial select pattern. An encoder determines an encoded value based upon the wordline select pattern that is compared to an expected encode value. The encode value has fewer than twice the number of address bits used to determine the wordline select pattern.

20 Claims, 4 Drawing Sheets

MEMORY DEVICE AND METHOD USING ENCODE VALUES FOR ACCESS ERROR CONDITION DETECTION

BACKGROUND

1. Field of the Disclosure

The present disclosure relates generally to electronic devices and more particularly to memory devices.

2. Description of the Related Art

A typical memory module includes a memory array having a plurality of select interconnects that are used to access a specific portion of the memory array during an access cycle. The select interconnects typically include a plurality of spatial select interconnects. The term "spatial select interconnect" as used herein refers to select interconnects of a memory array associated with a common spatial orientation. Examples of spatial select interconnects includes, wordlines, column select lines, and block select lines. A memory address that identifies a portion of memory to be accessed is received at a decoder of the memory module and decoded during a memory access cycle to provide a spatial select pattern to the spatial select interconnects. A memory access error occurs when a spatial select pattern results in multiple spatial select interconnects being enabled during the same memory cycle. Such access errors can be the result of manufacturing errors, a hard error, or spurious one-time events, a soft error.

In order to detect access errors, and thereby increase the reliability of a memory module, it has been proposed that the actual spatial select pattern at a spatial select interconnect be encoded to determine an encoded address that should match the address received at the memory module. When the encoded address matches the actual address the access of the current access cycle is verified. However, when the encoded address does not match the actual address, the access of the current access cycle is not validated.

BRIEF DESCRIPTION OF THE DRAWINGS

The present disclosure may be better understood, and its numerous features and advantages made apparent to those skilled in the art by referencing the accompanying drawings.

DETAILED DESCRIPTION

According to a specific embodiment of the present disclosure, the wordlines and column selects of a memory array are used to select transistors arranged in a wire-ORed configuration to generate an encode values that are used to detect if an access error condition exists for a given access cycle. The encode values are chosen so that no valid encode value can alias an error condition caused by multiple wordlines being enabled or by one wrong select line being enabled. In addition, the encode values can be chosen to have fewer than twice the number of address bits that are used to determine a wordline or column select pattern by an address decoder.

For example, during a memory access cycle of a memory module, an input address is decoded to provide a set of signals, referred to as a wordline select pattern, to a corresponding set of wordlines (a wordline interconnect), and another set of signals, referred to as a column select pattern, to a corresponding set of column select lines (column select interconnect). The wordline and column select patterns are used to control access of information stored at memory cells of the memory array and to enable additional gates at an encoder that uniquely generates an encode value for each corresponding wordline and column select pattern. In a particular embodiment, the gates of the encoder are wired-OR together to form a final bit line that is sensed to read out the encode values. Based upon the encode value it is determined whether an actual select pattern at the memory array during a given access cycle matches an expected select pattern for the address being decoded, therefore verifying validity of the access cycle. The encode values are selected to prevent a valid select pattern from aliasing an invalid select pattern. The encode values are further chosen to have fewer than twice $2^N$ bits, where N is the number of address bits decoded to generate a corresponding select pattern. Embodiments of the present disclosure will be better understood with reference to FIGS. 1-5 herein.

Figure 1:
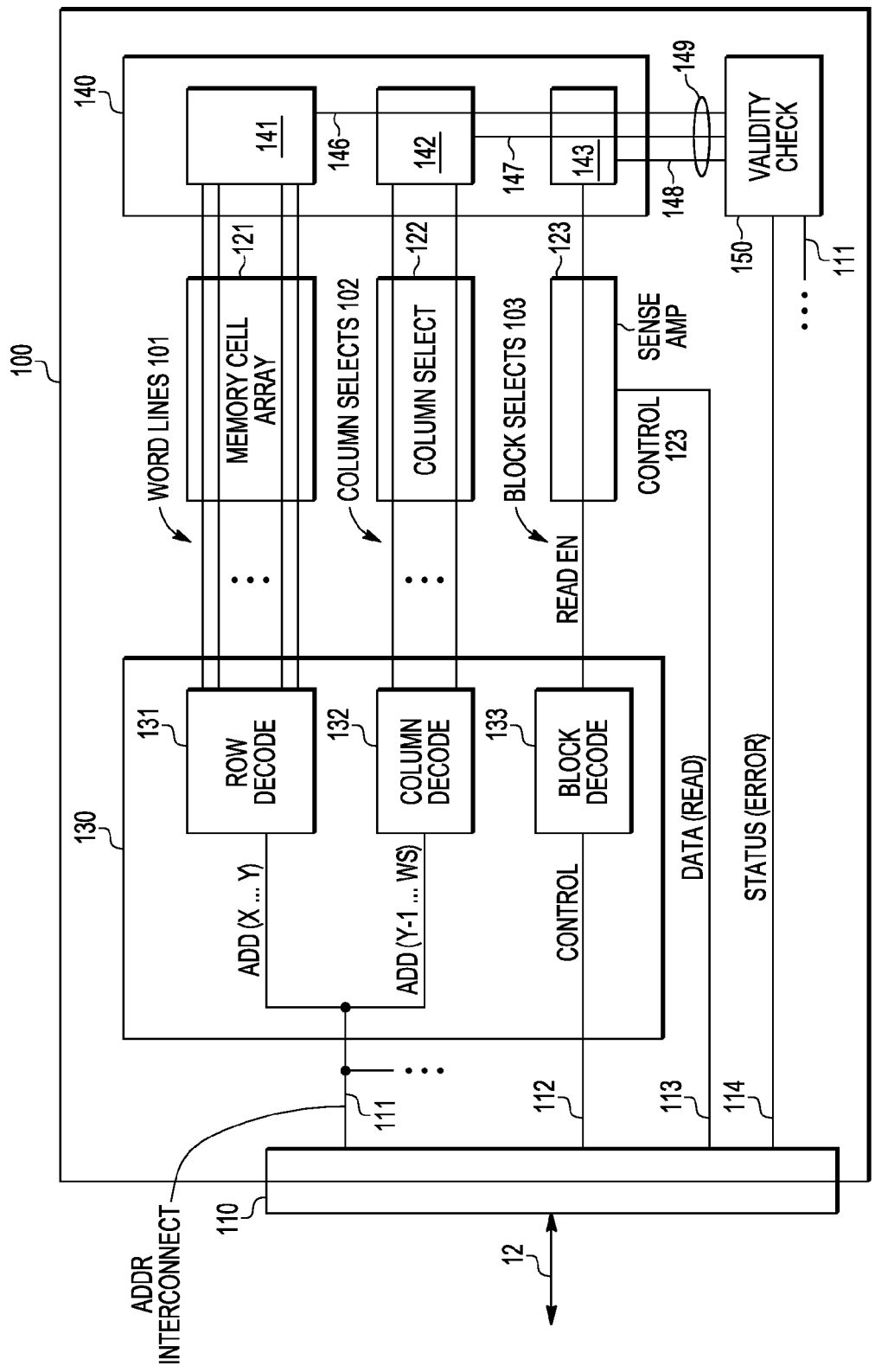
FIG. 1 illustrates a system including a memory module in accordance with a specific embodiment of the present disclosure.

FIG. 1 illustrates a system 10 that includes a memory module 100. Memory module 100 includes a bus interface 110, an address decoder 130, a memory cell array 121, a column select module 122, sense amplifier 123 (sense amp), select pattern encoder 140, and validity check module 150. Bus interface 110 is connected to external interconnect 12, to address interconnect 111, to control interconnect 112, to data interconnect 113, and to status interconnect 114. Access decoder 130 includes a row decoder 131 that is connected to a first portion of the address interconnect 111, a column decoder 132 that is connected to a second portion of the address interconnect 111, and a block decoder 133 that is connected to the control interconnect 112. Row decoder 131, column decoder 132, and block decoder 133 are connected to wordlines 101, column selects 102, and block selects 103, respectively. Memory cell array 121 is connected to the wordlines 101, and to one or more memory array bit lines (not shown). Column select module 122 is connected to the column selects 102, to the memory array bit lines (not shown), and to column select bit lines (not shown). Sense amp 123 is connected to a block select interconnect labeled READ EN, to the column select bit lines (not shown), and to the data interconnect.

The encoder 140 includes a wordline encoder 141 that is connected to the wordlines 101, a column select encoder 142 that is connected to the column selects 102, and a block encoder 143 that is connected to the block selects 103. Encode interconnects 149 are connected to an output of the encoder 140 and include wordline encode interconnects 146, column select encode interconnects 147, and block select encode interconnects 148.

The term "interconnect" as used herein, and its variants, is used herein to refer to various features that can communicate information between various modules either directly or indirectly. For example, an interconnect can be implemented as a passive device, such as one or more conductive traces, that transmits information directly between various modules, or as an active device, whereby information being transmitted is buffered, e.g., stored and retrieved, in the processes of being communicated between devices, such as at a first-in first-out memory or other memory device. By way of example, the term "bus" as used herein is presumed to refer to an interconnect having one or more conductive traces that communicate information between a source and destination.

During operation, a requesting device (not shown) provides memory access information, such as address and control information, to the memory module 100 via the external interconnect 12. The address information is provided to the decoder 130, via interconnect 111, to generate a desired wordline select pattern and a desired column select pattern that together identify a specific portion of the memory cell array 121. Control information is provided to the decoder 130, via interconnect 112, to generate other control information, such as a read enable signal, that is used to facilitate an access of the memory array portion identified by the decoder 130. For example, the read enable signal can enable sense amplifiers that read bitlines The wordline select pattern that has been chosen to correspond to a portion of the address received at the row decode module 131 is referred to as the desired wordline select pattern, or as the valid wordline select pattern of the corresponding address. During error-free operation, the desired wordline select pattern of a received address and the signals actually present at the wordlines, referred to herein as the actual wordline select pattern, will be the same. However, during errant operation, the actual wordline select pattern can be an invalid pattern due to hard errors or soft errors being introduced at various locations of memory module 100.

By way of example, operation of the encoding features of the memory array 100 are primarily discussed with reference to the wordlines 101, though it will be appreciated that the same encoding techniques can be applied in combination, or individually, to the column select lines 102 and to the block selects lines 103. By further example, it is presumed that a wordline being driven to a high voltage level is enabled (selected/asserted) and that a wordline being driven to a low voltage level is not enabled (not-selected/negated). Each valid wordline select pattern for memory module 100 has only one selected wordline with the remaining wordlines being negated. Therefore, a wordline select pattern at wordline interconnect 101, referred to as an actual wordline select pattern, is an invalid wordline select pattern of the memory array module 100 if two or more wordlines of the memory array 121 are selected.

Alternatively, an actual wordline select pattern can be a valid wordline select pattern of the memory array module, but an invalid wordline select pattern for a particular address. In this situation, the actual wordline pattern is an invalid pattern because it does not match the expected wordline select pattern, but is a valid wordline select pattern for another input address. For example, an actual wordline select pattern having only the third wordline asserted is an invalid pattern if the expected wordline select pattern that corresponds to the particular address of the access cycle is different than the actual wordline select pattern.

In order to validate a memory access, the actual wordline select pattern is encoded by encoder 140 to generate an encode value that is provided to the validity check module 150. The validity check module 150 includes a translate module (not shown) that determines an expected encode value based upon the input address. The translate module can include a look-up table or logic module that provides the expected select pattern based upon the input address at the address interconnect. The expected encode value determined by the translate module is compared to the actual encode value determined by the encoder 140. If the actual encode value matches the expected encode value, the current access cycle is considered valid and a signal ERROR is negated. Otherwise, if the actual encode value does not match the expected encode value, the current access is considered invalid, and the signal ERROR is asserted.

In accordance with the present disclosure, the encode values are chosen to avoid any valid encode value from aliasing any invalid encode value. Furthermore, the encode values are assigned to specific wordline select patterns to allow for an area efficient implementation of the enable module 140 that uses wire-ORed logic. Characteristics of the encode values and their selection will be better understood with reference to the tables and figures herein.

Figure 2:
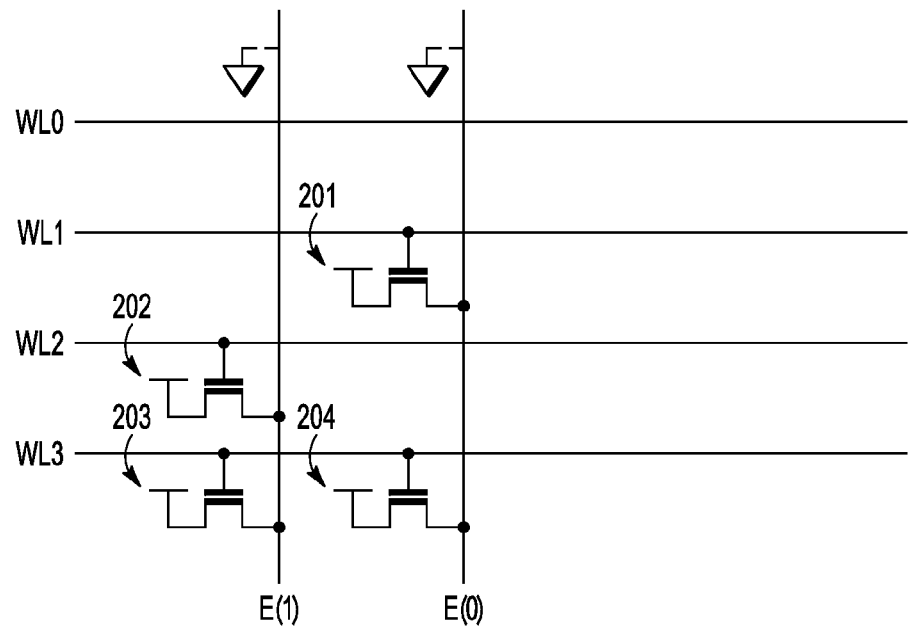
FIG. 2 illustrates a prior art encoder.

Aliasing occurs when a valid encode value is generated for a current access cycle even though the actual wordline select pattern generated for the current address is invalid. FIG. 2 includes wordlines WL0 through WL3, and bitlines E(1) through E(0), and represents a specific prior art schematic diagram of the wordline encoder 141 of FIG. 1 that generates an encode value based on the wordline select pattern at wordlines WL0 through WL3. Each of the bitlines E(0) and E(1) are precharged by a pull-down device to a low voltage level that represents a low voltage logic state, referred to herein as zero or logic zero. Bit line E(1) is pulled to a high-voltage logic state, referred to herein as one or logic one, by transistors 202 or 203 in response to either WL2 or WL3 being asserted, i.e. a logic one. Bit line E(0) is pulled to a high-voltage logic state by transistors 201 or 204 in response to either WL1 or WL3 being asserted.

The operation of the wordline encoder of FIG. 2 is described with reference to six memory access cycles represented in Table 1, in which the access cycles 1-4 represent error-free access cycles, the access cycle 5 represents an access cycle during which an error is detected, and access cycle 6 represents an access cycle during which aliasing occurs.

TABLE 1

| Cycle | Input Address | Input Address (Binary) | Desired Wordline | Actual Wordline Select Pattern | Encode value | Operation Represented |
|---|---|---|---|---|---|---|
| 1 | A(0) | 00 | WL0 | 0001 | 00 | Error-Free |
| 2 | A(1) | 01 | WL1 | 0010 | 01 | Error-Free |
| 3 | A(2) | 10 | WL2 | 0100 | 10 | Error-Free |
| 4 | A(3) | 11 | WL3 | 1000 | 11 | Error-Free |
| 5 | A(0) | 00 | WL0 | 0011 | 01 | Error Detected |
| 6 | A(3) | 11 | WL3 | 1010 | 11 | Error aliased |

Referring to Table 1, the column labeled Cycle includes values 1 through 6, each of which identify a corresponding access cycle of a memory module. The column labeled Input Address includes values that are pneumonic representation of valid addresses, A(0) through A(3), that are received at the decoder of a memory module during a particular access cycle. The column labeled Input Address (Binary) indicates, in binary form, the binary value that corresponds to the received address of the indicated access cycle. The column labeled Desired Wordline includes pneumonic representations indicating a particular wordline (WL0 through WL3) that is asserted during error-free operation of the indicated access cycle. The column labeled Actual Wordline Select Pattern represents the actual logic states, in binary form, of each wordline of the memory module during a corresponding access cycle, where the left-most bit represents the logic state of WL3 and the right-most bit represents the state of WL0. The column labeled Encode Value represents the desired encode value generated by the encoding circuitry of FIG. 2 in response to the Actual Wordline Select Pattern generated during the access cycle. Note that for simplicity it is assumed that the desired encode value is the encode value actually generated. The column labeled Operation Represented includes information indicating operational information for corresponding access cycles.

During access cycle 1, The address A(0) (00b) has been received at the decoder of the memory module 100. During error-free operation, the desired wordline for assertion is WL0, and the actual wordline select pattern generated is 0001b, which is the expected/desired select pattern for an input address of A(0). The encoder 141 generates an actual encode value of 00b based upon the actual wordline select pattern 0001b. The encode value 00b represents the expected/desired value for the wordline select pattern of 0001b. As indicated in the last column of Table 1, access cycle 1 of Table 1 represents error-free operation in that the access occurred as it was intended. Similarly, the access cycles 2 through 4 of Table 1 represent error free operation for each other valid input address A(1), A(2), and A(3) of the simple example presented.

Access cycle 5 represents an access cycle of the memory module at which an error is detected. During access cycle 5, the address A(0) has been received at the decoder 131 of the memory module 100, therefore, WL0 is the wordline that is expected to be asserted. However, two wordlines are actually asserted (WL0 and WL1) during access cycle 5 as indicated by the two zeros in the pattern 0011b of the Actual Wordline Select Pattern column. It will be appreciated that the assertion of the additional errant wordline that corresponds to WL1 can occur due to a manufacturing error, or due to a one-time transient error. The actual wordline select pattern 0011b, which is invalid for address A(0), results in the encoder 141 of FIG. 2 generating an actual encode value of 01b. Note that this actual encode value is expected, e.g., valid, with respect to the wordline select pattern 0011b. However, an error is detected, as indicated in the Operation Represented column of Table 1, because the actual encode value (01b) does not match the expected encode value (00b) for the address A(0).

Access cycle 6 represents an access cycle of the memory module at which an error condition is aliased, and therefore not detected. During access cycle 6, the address A(3) has been received at the decoder 131 of the memory module 100, therefore, WL3 is the wordline that is expected to be asserted. However, the actual wordline select pattern generated during access cycle 6 is 1010b, which indicates both wordlines WL3 and WL1 are asserted. It will be appreciated that the assertion of the additional wordline corresponding to WL1 can occur due to a manufacturing error, or a one-time transient error. The actual wordline select pattern (1010b), which is invalid for address A(3), results in the encoder 141 generating an encode value of 11b, which is the valid encode value for address A(3). Therefore, because the actual encode value based on the invalid select pattern (1010b) matches the expected encode value for A(3), the error is aliased, not detected, as indicated in the Operation column.

Figure 3:
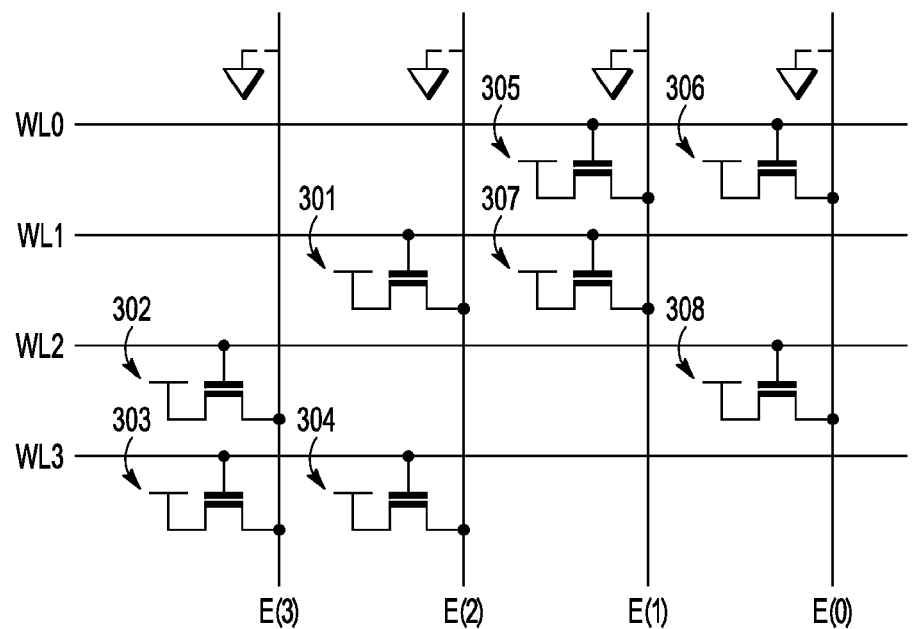
FIG. 3 illustrates a prior art encoder.

FIG. 3 illustrates a prior art schematic of an alternate encoding scheme that generates an encode value portion that is the same encode values of FIG. 2 and a portion that is the complement of the encode values of FIG. 2. FIG. 3 represents a specific prior art schematic diagram of the wordline encoder 141 of FIG. 1 that generates an encode value based on the wordline select pattern at wordlines WL0 through WL3. FIG. 3 includes wordlines WL0 through WL3, and bitlines E(3) through E(0). Bitlines E(3) through E(0) are precharged to a low voltage level that represents a logic zero by a pull-down device. Bit line E(3) is similar to bit line E(1) of FIG. 2 and is pulled to a high-voltage logic state by transistors 302 or 303 in response to either WL2 or WL3 being asserted, i.e. a logic one. Bit line E(2) is similar to bitline E(0) of FIG. 2 and is pulled to a high-voltage logic state by transistors 301 or 304 in response to either WL1 or WL3 being asserted. Transistors 305 and 307 implement at bitline E(1) logic complementary to the logic of Bit line E(3). Transistors 306 and 308 implement at bitline E(0) logic complementary to the logic of Bit line E(2).

The operation of the wordline decoder of FIG. 3 is described with reference to six memory access cycles as indicated in Table 2, in which the access cycles 1-4 represent error-free access cycles, and the access cycle 5 represents an access cycle during which an error is detected.

TABLE 2

| Cycle | Desired Address | Address Input (Binary) | Desired Wordline | Actual Wordline Select Pattern | Encode value | Operation Represented |
|---|---|---|---|---|---|---|
| 1 | A(0) | 00 | WL0 | 0001 | 00 11 | Error-Free |
| 2 | A(1) | 01 | WL1 | 0010 | 01 10 | Error-Free |
| 3 | A(2) | 10 | WL2 | 0100 | 10 01 | Error-Free |
| 4 | A(3) | 11 | WL3 | 1000 | 11 00 | Error-Free |
| 5 | A(0) | 00 | WL0 | 0011 | 01 11 | Error Detected |
| 6 | A(3) | 11 | WL3 | 1010 | 11 10 | Error Detected |

As indicated in Table 2, the encoder of FIG. 3 generates encode values that include true and complement representations of the input address. Therefore, as indicated for access cycles 1-4 of Table 2, the valid encode value is 0011b for desired address A(0), the valid encode value is 0110b for desired address A(1), the valid encode value is 1001b for desired address A(2), and the valid encode value is 1100b for desired address A(3). At access cycle 5 of Table 2, the actual encode value is 0111b based on the errant actual wordline select pattern 0011b. Therefore, an error is detected because the actual encode value does not match the expected encode value during access cycle 5. At access cycle 6 of Table 2, the actual encode value is 1110b based on the errant actual wordline select pattern 1010b. Note the encode value 1110b at access cycle 6 that is based upon an errant wordline select pattern (1010) cannot be masked by the expected wordline select pattern (1000) for address A(3), as occurred at cycle 6 when the encoder of FIG. 2 was used, because the encode value of the encoder of FIG. 3 includes both true and complement representations of the input. However, the prior art encoder of FIG. 3 requires twice as many bit lines to represent each encode value as address bits used to access the memory array. As a result, the space needed to implement the needed transistors to encode the possible wordline select patterns is based upon the equation (2^Abits)*2, where Abits is the number of address bits used to generate the wordline select pattern.

In accordance with a particular embodiment of the disclosure, selection of a set of encode values that have a fixed number of zeros for all valid encode values of the memory module results in encode values having fewer than twice the number of bit positions as the address used to generate the wordline select patterns. In addition, assignment of the encode values to the set of encode values can result in an encode circuit requiring fewer transistors than that required by the scheme described with reference to FIG. 3.

Table 3 indicates unique sets of encode values having exactly two zeros, and a fixed bit position size of two, three or four. Therefore, while there are 3 unique encode values having exactly two zeros for encode values having three bits, there are 6 unique encode values having exactly two zeros for encode values having four bits.

TABLE 3

| Bitfield Size of Encode Value | Encode Value | Number of Unique Values |
|---|---|---|
| 2 | 00 | 1 |
| 3 | 001 | 3 |
|  | 010 |  |
|  | 100 |  |
| 3 | 0011 | 6 |
|  | 1100 |  |
|  | 0101 |  |
|  | 1010 |  |
|  | 1001 |  |
|  | 0110 |  |

Table 4 indicates the number of unique encode values for encode values having bit position sizes from 5 to 13, and fixed number of zeros from 2 to 9. For example, according to Table 4, there are fifty-six eight-bit encode values having exactly 3 zeros, and there are seventy eight-bit encode values having exactly 4 zeros.

TABLE 4

| BITS | 2 Zeros | 3 Zeros | 4 Zeros | 5 Zeros | 6 Zeros | 7 Zeros | 8 Zeros | 9 Zeros |
|---|---|---|---|---|---|---|---|---|
| 5 | 10 | 10 | 5 | 1 |  |  |  |  |
| 6 | 15 | 20 | 15 | 6 | 1 |  |  |  |
| 7 | 21 | 35 | 35 | 21 | 7 | 1 |  |  |
| 8 | 28 | 56 | 70 | 56 | 28 | 8 | 1 |  |
| 9 | 36 | 84 | 126 | 126 | 84 | 36 | 9 | 1 |
| 10 | 45 | 120 | 210 | 252 | 210 | 120 | 45 | 10 |
| 11 | 55 | 165 | 330 | 462 | 462 | 330 | 165 | 55 |
| 12 | 66 | 220 | 495 | 792 | 924 | 792 | 495 | 220 |
| 13 | 78 | 286 | 715 | 1287 | 1716 | 1716 | 1287 | 715 |

It will be appreciated that each possible input address of a memory array can be assigned a unique encode value having a fixed number of zeros so long as the number of valid input addresses of the memory array is less than or equal to the number of unique encodings as indicated in Table 4. For example, a memory controller having a five-bit address that is used to enable one of 32 wordlines can assign a unique seven-bit encode value for each corresponding address value, wherein each seven-bit encode value has exactly three zeros or four zeros. Alternatively, a larger bit-count encode value can be used, such as eight-bit encode values having three, four or five zeros.

Figure 4:
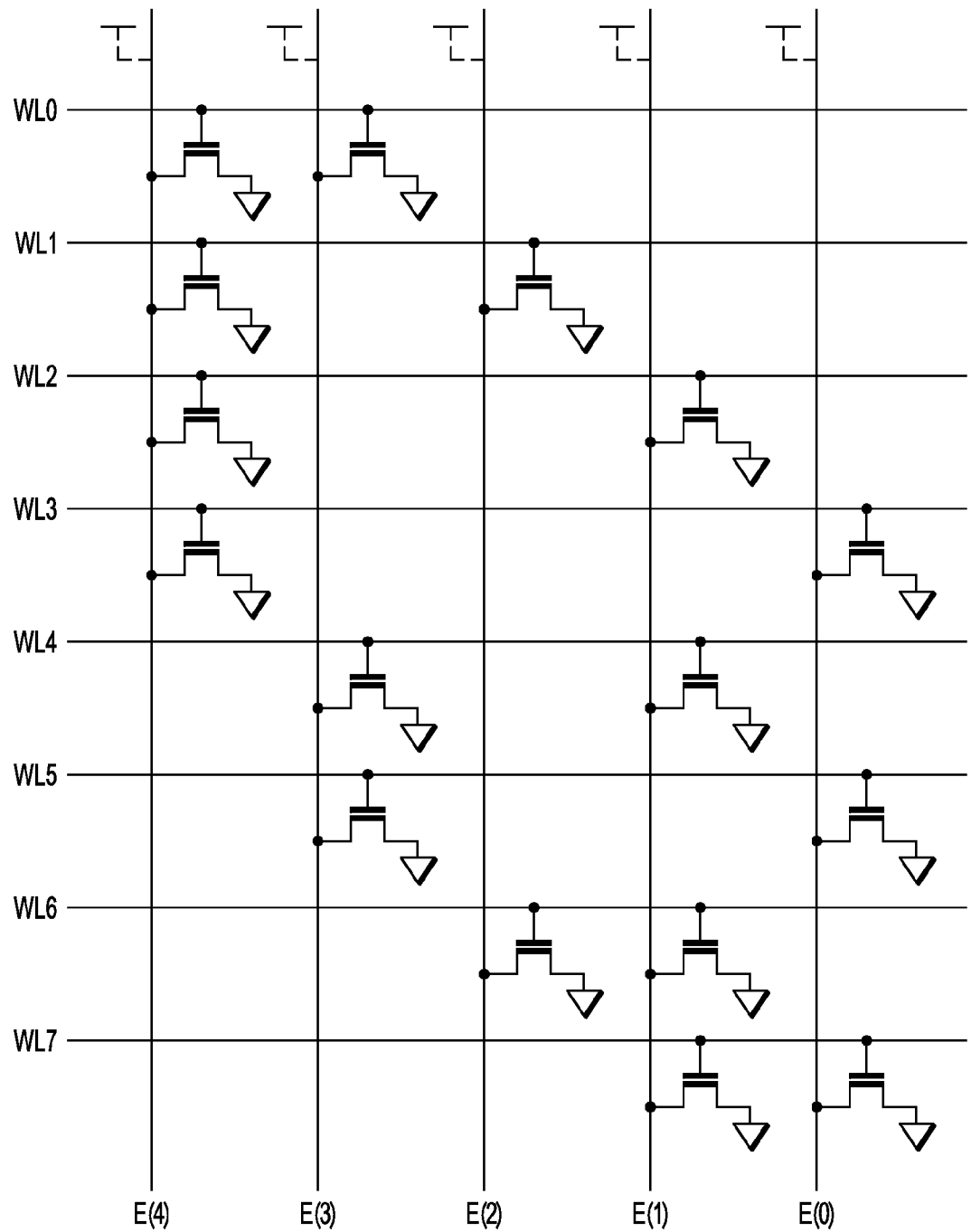
FIG. 4 illustrates an encoder in accordance with a specific embodiment of the present disclosure.

Table 5 illustrates a simple embodiment where a three bit input address is used to enable one of eight wordlines (WL0-WL7) and each wordline has an expected wordline select pattern having two zeros distributed amongst a total of 5-bits. FIG. 4 is a schematic diagram illustrating a specific embodiment of a transistor schematic implementing a wordline encoder based upon the encode values of table 5.

TABLE 5

| Asserted Wordline | Encode Value |
|---|---|
| WL0 | 00111 |
| WL1 | 01011 |
| WL2 | 01101 |
| WL3 | 01110 |

TABLE 5-continued

| Asserted Wordline | Encode Value |
|---|---|
| WL4 | 10101 |
| WL5 | 10110 |
| WL6 | 11001 |
| WL7 | 11100 |

FIG. 4 illustrates in schematic form, an encode circuit based upon the encode values of Table 5. FIG. 4 includes wordlines WL0 through WL7 of a memory array, and bitlines E(4) through E(0) that provide an encode value during each access cycle. Bitlines E(4)-E(0) are precharged to a high-level logic voltage, and are connected to a plurality of pull-down NMOS transistors. Each NMOS transistor of FIG. 4 includes a current electrode connected to one bitline, a current electrode connected to ground, and a control electrode connected to one wordline. NMOS transistors controlled by WL0 have current electrodes connected to bitlines E(4) and E(3); NMOS transistors controlled by WL1 have current electrodes connected to bitlines E(4) and E(2); NMOS transistors controlled by WL2 have current electrodes connected to bitlines E(4) and E(1); NMOS transistors controlled by WL3 have current electrodes connected to bitlines E(4) and E(0); NMOS transistors controlled by WL4 have current electrodes connected to bitlines E(3) and E(1); NMOS transistors controlled by WL5 have current electrodes connected to bitlines E(3) and E(0); NMOS transistors controlled by WL6 have current electrodes connected to bitlines E(2) and E(1); NMOS transistors controlled by WL7 have current electrodes connected to bitlines E(1) and E(0).

It will be appreciated that use of the encode values of Table 5, as implemented in the circuit of FIG. 4, prevent the encode value of any valid wordline from masking the encode value of any other wordline, thereby avoiding the possibility of aliasing due to the assertion of multiple select lines. Furthermore, only five-bit lines are needed to represent the encode value, as opposed to the six-bit lines that previous techniques would use to generate an encode value that includes the original input address value and its complement.

Table 6 illustrates the same encode values of Table 5 assigned to different ones of the wordlines WL0 through WL7 such that complementary encode values are assigned to adjacent wordlines. As used in the present example, the term "complementary values" refers to two values having no more than one zero at a common bit position. Note, however, that complementary values can both have a one at a common bit position. Therefore, the values 0011b and 1100b are complementary values, as are the values 00111b and 11100b.

TABLE 6

| Asserted Wordline | Encode Value |
|---|---|
| WL0 | 00111 |
| WL1 | 11100 |
| WL2 | 01011 |
| WL3 | 10101 |
| WL4 | 01101 |
| WL5 | 10110 |
| WL6 | 01110 |
| WL7 | 11001 |

Figure 5:
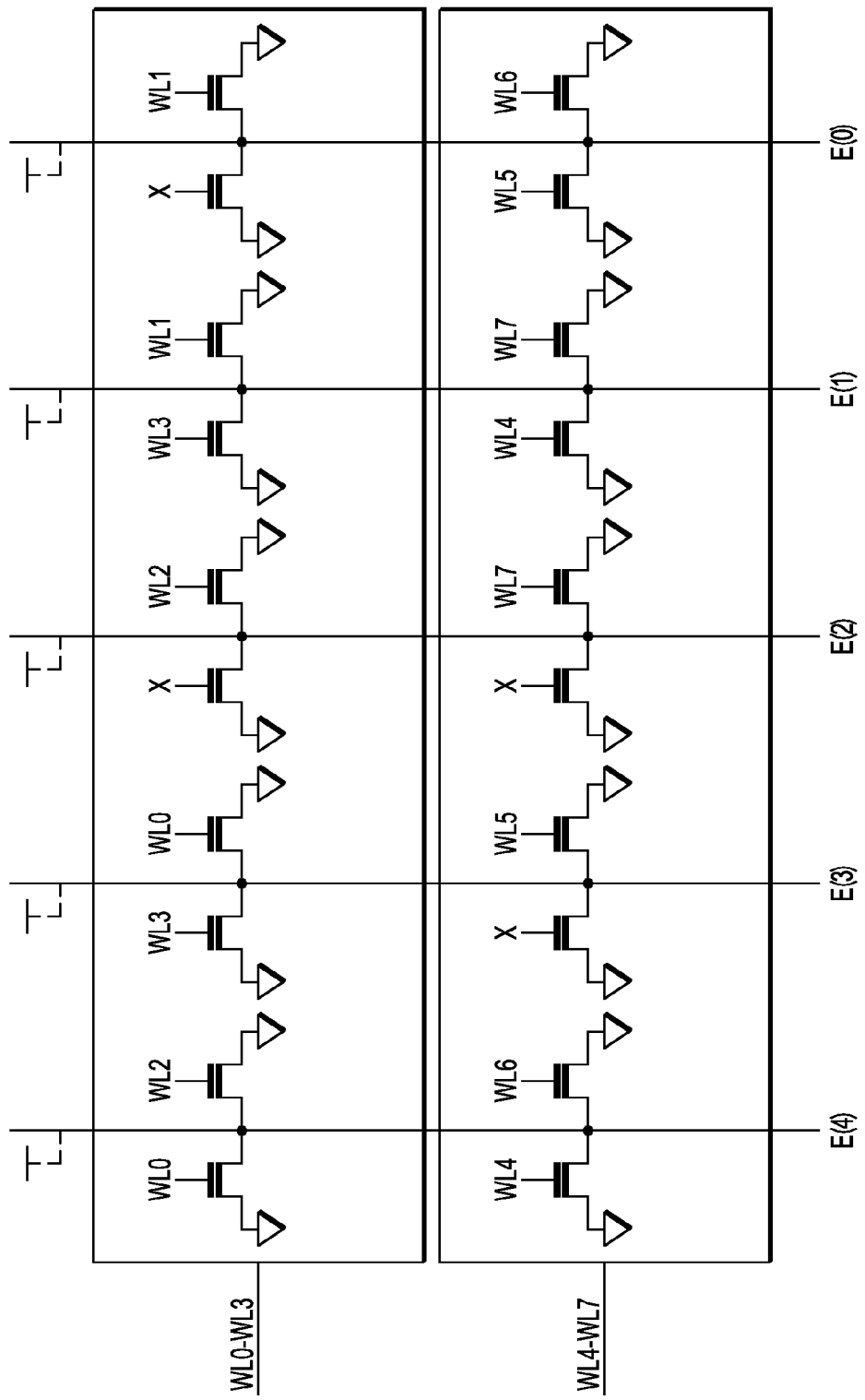
FIG. 5 illustrates an encoder in accordance with a specific embodiment of the present disclosure.

FIG. 5 illustrates in schematic form, an encode circuit based upon the encode values of Table 6, and includes wordlines WL0 through WL7 from a memory array, and bitlines E(4) through E(0) that provide an encode value during each access cycle. Bitlines E(4)-E(0) are precharged to a high-level logic voltage, and are connected to a plurality of pull-down NMOS transistors. Each NMOS transistor of FIG. 5 includes a current electrode connected to one bitline, a current electrode connected to ground, and a control electrode connected to one wordline. NMOS transistors controlled by WL0 have current electrodes connected to bitlines E(4) and E(3); NMOS transistors controlled by WL1 have current electrodes connected to bitlines E(1) and E(0); NMOS transistors controlled by WL2 have current electrodes connected to bitlines E(4) and E(2); NMOS transistors controlled by WL3 have current electrodes connected to bitlines E(3) and E(1); NMOS transistors controlled by WL4 have current electrodes connected to bitlines E(4) and E(1); NMOS transistors controlled by WL5 have current electrodes connected to bitlines E(3) and E(0); NMOS transistors controlled by WL6 have current electrodes connected to bitlines E(4) and E(0); NMOS transistors controlled by WL7 have current electrodes connected to bitlines E(2) and E(1). Transistors having an "X" indicated at their gate represent transistors that are not used with respect to a specific set of four wordlines, and therefore can be placed in a non-conductive state.

It will be appreciated that use of the encode values of Table 6 prevent the encode value of any wordline from masking the encode value of any other wordline, thereby avoiding the possibility of aliasing due to the assertion of multiple select lines. Furthermore, only five-bit lines are needed to represent the encode value, as opposed to the six-bit lines that previous techniques would use to generate an encode value that includes the original input address value and its complement. In addition, the use of complementary encode values allows for a closely packed wordline encoder that allows the diffusion area between encoder transistors to be shared within an area defined by the spacing of four wordlines.

Any one or more benefits, one or more other advantages, one or more solutions to one or more problems, or any combination thereof have been described above with regard to one or more specific embodiments. However, the benefit(s), advantage(s), solution(s) to problem(s), or any element(s) that may cause any benefit, advantage, or solution to occur or become more pronounced is not to be construed as a critical, required, or essential feature or element of any or all the claims.

Other embodiments, uses, and advantages of the present disclosure will be apparent to those skilled in the art from consideration of the specification and practice of the disclosure disclosed herein. For example, the selection and pairing of complementary pairs of encode values readily extends to any size memory array by selecting encode values having more bit positions and different fixed numbers of zeros as discussed with reference to Table 4. Furthermore, it will be appreciated that in the examples herein complementary pairs are based upon not masking zeros. In other logical implementations it will be appreciated that complementary pairs can be chosen to not mask ones. In addition, the disclosure has described a particular embodiment with respect to wordlines, though it will be appreciated that the concepts can be used with respect to other spatial components of a memory array, such as column select lines, block select lines, the like, and combinations thereof. The specification and drawings should be considered exemplary only, and the scope of the disclosure is accordingly intended to be limited only by the following claims and equivalents thereof.

Aspects of the embodiments herein may be partially implemented in software stored in volatile or non-volatile memory in the module shown in FIG. 1. For example, software may be stored in non-volatile portions of the module, loaded into volatile memory and executed. Thus, embodiments of the present invention may include features or processes embodied within machine-executable instructions provided by a machine-readable medium such as nonvolatile memory. Such a medium may include any mechanism which stores data in a form accessible by a machine, such as a microprocessor or, more generally, a computer system. A machine readable medium may include volatile and/or non-volatile memory, such as read only memory (ROM); random access memory (RAM); magnetic disk storage media; optical storage media; flash memory devices; tape, or other magnetic, optical or electronic storage medium. Such stored instructions can be used to cause a general or special purpose processor, programmed with the instructions, to perform processes of the present invention.

Note that some of the processes of the present invention may include hardware operating in response to programmed instructions. Alternatively, processes of the present invention may be performed by specific hardware components containing hard-wired logic such as state machines to perform operations or by any combination of programmed data processing components and hardware components. Thus, embodiments of the present invention may include software, data processing hardware, data processing system-implemented methods, and various processing operations, as described herein.

Thus, various embodiments have been described. Note that the description of the invention set forth herein is illustrative, and is not intended to limit the scope of the invention as set forth in the following claims. Variations and modifications of the embodiments disclosed herein may be made based on the description set forth herein, without departing from the scope of the invention as set forth in the following claims.

Although the invention is described herein with reference to specific embodiments, various modifications and changes can be made without departing from the scope of the present invention as set forth in the claims below. For example, the encoding techniques described herein can be applied to each type of spatial select lines, or to any subset. Thus the encoding techniques could be applied to each of the wordlines, column select lines, and block select lines, or to any one or two of these sets.

The term "coupled," as used herein, is not intended to be limited to a direct coupling or a mechanical coupling. Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

What is claimed is:

1. A method comprising:
receiving, at a select decoder of a memory module, N bits of an input address value received at the memory module, the N bits corresponding to a first valid spatial select pattern to be provided to a corresponding select interconnect by the select decoder during a decode portion of a first access cycle; and
determining, during an encode portion of the first memory access cycle, a first encoded value at an encode interconnect, the encode interconnect having a bit size less than twice N (2×N), wherein no desired encode value at the encode interconnect for any received N bits can alias a desired encoded value corresponding to an invalid spatial select pattern of the received N bits.

2. The method of claim 1, wherein the spatial select pattern is a set of wordline select signals.

3. The method of claim 1, wherein the spatial select pattern is a set of column select signals.

4. The method of claim 1, wherein the spatial select pattern is a set of block select signals.

5. The method of claim 1, wherein the spatial select pattern is a set of signals including one or more of wordline select signals, column select signals, and block select signals.

6. The method of claim 1, wherein the invalid spatial select pattern is invalid for the memory module.

7. The method of claim 1, wherein the invalid spatial select pattern is a valid spatial select pattern of the memory module, but not for the received N bits.

8. The method of claim 1, wherein determining the first encoded value at the select interface includes wire-ORing a plurality of switches.

9. The method of claim 8, wherein each wire-ORed switch of the corresponding plurality of switches is controlled by a corresponding bit of the asserted memory array select pattern.

10. The method of claim 8, wherein each switch of the plurality of switches includes a pair of switches.

11. The method of claim 1 further comprising:
   determining an expected encoded value based on the N bits of the input address value; and
   determining a validity of the first access cycle based upon a comparison of the first encoded value to the expected encoded value.

12. A method of accessing a memory array comprising:
   receiving at a decode module N address bits, the N address bits corresponding to a first valid spatial select pattern of a plurality of valid spatial select patterns of the memory array to be asserted at a set of spatial select interconnects, each valid spatial select pattern of the memory array having M-bit positions, where M is greater than N;
   determining a desired encode value based upon an asserted spatial select pattern at the set of spatial select interconnects, wherein desired encode value of the memory array has a first number of logic 1s, and a second number of logic 0s, a sum of the first and second number is less than two times N (2×N).

13. The method of claim 12, wherein the number of invalid encode values of the memory module having first number of logic is less than one-half the number of valid encode values having the first number of logic 1s.

14. The method of claim 12, wherein the number of logic 1s of each desired encode value is the same as the number of logic 0s in each desired encode value.

15. The method of claim 12, wherein determining the desired encode value includes wire-ORing a plurality of switches controlled by bits of the desired encode value.

16. The method of claim 12 further comprising:
   determining an expected encoded value based on the N address bits; and
   determining a validity of an access of the memory array based upon a comparison of the first encoded value to the expected encoded value.

17. A device comprising:
   a wordline encoder comprising an N-bit input coupled to N wordlines including wordlines WL_1 through WL_N, and an M-bit output to provide an encoded value for each valid word line pattern, the wordline encoder further comprises
   a plurality of encode blocks, each encode block coupled to the N wordlines, and comprising M transistor sets, each transistor set comprising an output corresponding to one of the M-bit outputs, wherein
      each encode block to provide a first valid encode value for one valid word line pattern and a second valid encode value that is the complement of the first valid encode value for a different valid wordline pattern.

18. The device of claim 17, wherein each transistor set is a two transistor set.

19. The device of claim 17, wherein each transistor of each transistor set is wire-ORed to each other transistor of the transistor set.

20. The device of claim 17, wherein each transistor set is to have no more than one conductive transistor for any valid encode value.

* * * * *